(12) United States Patent
Miyake et al.

(10) Patent No.: US 6,483,887 B2
(45) Date of Patent: Nov. 19, 2002

(54) TIMER CONTROL CIRCUIT

(75) Inventors: Takashi Miyake, Tokyo (JP);
Kazuyuki Iwaguro, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/992,428

(22) Filed: Nov. 26, 2001

(65) Prior Publication Data

US 2002/0154726 A1 Oct. 24, 2002

(30) Foreign Application Priority Data

Apr. 19, 2001 (JP) ........................................ 2001-121706

(51) Int. Cl.$^7$ .............................................. H01H 43/00
(52) U.S. Cl. ........................... 377/20; 700/306; 702/79; 702/176
(58) Field of Search ........................... 377/20; 700/306; 702/79, 176–178

(56) References Cited

U.S. PATENT DOCUMENTS 6,201,448 B1 * 3/2001 Tam et al. ..................... 331/25

FOREIGN PATENT DOCUMENTS

JP 6-324957 11/1994

* cited by examiner

*Primary Examiner*—Margaret R. Wambach
(74) *Attorney, Agent, or Firm*—Leydig, Voit & Mayer, Ltd.

(57) ABSTRACT

A timer control circuit includes timers that perform count operations. A signal selection circuit selectively passes underflow signals supplied from the timers, based on control signals. A flip-flop is supplied with an output of the signal selection circuit section as a toggle signal.

12 Claims, 5 Drawing Sheets

TIMER CONTROL CIRCUIT

FIELD OF THE INVENTION

The present invention relates to a timer control circuit for controlling an output of a timer incorporated in a computer such as a microcomputer. More particularly, the present invention relates to a timer control circuit capable of providing a complicated output waveform without casting a burden upon software.

BACKGROUND OF THE INVENTION

Conventionally, there is known the circuit shown in FIG. 5 that outputs signals having various waveforms from an external output terminal of a microcomputer by using an output signal of a timer incorporated in the microcomputer.

This circuit includes timers T1, T2, and T3, flip-flops ("F/F") F1, F2, and F3, and switches S1 to S6. The generated signal is output from the F/Fs F1, F2, and F3. The timers T1, T2, and T3 are set in a mode to automatically down count for two periods. Initial count values in the first and second periods are set to different values.

In the circuit shown in FIG. 5, the F/Fs are toggled based on an underflow signal or an overflow signal output from the respective timers T1, T2, and T3 when counting corresponding to one period is finished.

For example, When the timer T1 is started, it begins counting as shown in FIG. 6. If the switch S1 is ON at two time points t1 and t2 when the timer T1 has output an underflow signal, then an output signal of the flip-flop F1 is inverted and an output signal that is a one shot pulse can be generated.

Furthermore, a complicated waveform including two pulses maybe output by using any of the following two methods.

Method 1: This is a method used when one timer is provided for one flip-flop. For example, as shown in FIG. 5, only one timer T1 is connected to the flip-flop F1. When the timer T1 is started it begins counting as shown in FIG. 7. If the switch S1 is ON at two time points t1 and t2 when the timer T1 has output an underflow signal, then an output signal of the flip-flop F1 is inverted and an output signal of one shot pulse can be generated. Thereafter, the count value of the timer T1 is re-set, and the timer T1 is started again. As a result, the output signal of the flip-flop F1 is inverted at two time points t3 and t4 when the timer T1 has output an underflow signal, and a second pulse having a different width can be output.

Method 2: This is a method used when two or more timers are provided with one flip-flop. For example, as shown in FIG. 5, three timers T1, T2, and T3 are connected to the flip-flop F2. When the timers T1 and T2 are simultaneously started, the switch S2 is set ON. As shown in FIG. 8, the timers T1 and T2 begin counting. At a time point t1, the timer T1 outputs a first underflow signal, and an output of the flip-flop F2 is inverted. Subsequently, the switch S3 is changed to the ON state. If thereafter two underflow signals have been output from the timer T2, then the switch S2 is changed to the ON state. As a result, the output of the flip-flop F2 is inverted at a time point t2 when a first underflow signal has been output from the timer T2. Furthermore, at a time point t3 when a second underflow signal has been output from the timer T2, the output of the flip-flop F2 is inverted. Thereafter, the timer T1 causes a second underflow, and the output of the flip-flop F2 is inverted at a time point t4. As a result, the two-pulse waveform as shown in FIG. 4 is generated. Thus, in this technique, an output waveform as shown in FIG. 8 is obtained by selecting one among a plurality of timers by using switches.

Thus, in the conventional timer control circuit, one timer is started a plurality of times or one of a plurality of timers is selected when generating a complicated output waveform including two or more pulses. Therefore, switching of the states of the switches S1 to S6 and counter re-setting need to be conducted by software in a personal computer. This is disadvantageous because it increases the load of the software.

SUMMARY OF THE INVENTION

It is an object of this invention to provide a timer control circuit capable of simply providing a desired out put waveform without burdening the software with a load even in the case of a complicated waveform.

The timer control circuit of one aspect of this invention comprises a plurality of timers. Each timer counts up to a predetermined value and outputs an underflow signal when counting is over. Furthermore, a logic unit receives a control signal and the underflow signals from all of the timers, and based on the control signal passes one of the underflow signals as a toggle signal. Furthermore, a control unit receives the toggle signal from the logic unit. The control unit changes its output state based on the input timing of the toggle signal.

The timer control circuit of another aspect of this invention comprises a plurality of timers. Each timer counts up to a predetermined value, generates and outputs an enable during counting, and outputs an underflow signal when counting is over. Furthermore, a plurality of logic units commonly receive an underflow signal output from one of the timers and an enable signal output from at least one of the timers. Each logic unit receives a control signal and the underflow signals from some of the timers and based on the control signal passes one of the underflow signals as a toggle signal only during an effective interval of the enable signal(s). Furthermore, there are provided a plurality of control units. Each control unit receives the toggle signal from corresponding one of the logic units. Each control unit changes its output state based on the input timing of the toggle signal.

The timer control circuit of still another aspect of this invention comprises a plurality of timers. Each timer counts up to a predetermined value and outputs an overflow signal when counting is over. Furthermore, a logic unit receives a control signal and the overflow signals from all of the timers, and based on the control signal passes one of the overflow signals as a toggle signal. Furthermore, a control unit receives the toggle signal from the logic unit. The control unit changes its output state based on the input timing of the toggle signal.

The timer control circuit of still another aspect of this invention comprises a plurality of timers. Each timer counts up to a predetermined value, generates and outputs an enable during counting, and outputs an overflow signal when counting is over. Furthermore, a plurality of logic units commonly receive an overflow signal output from one of the timers and an enable signal output from at least one of the timers. Each logic unit receives a control signal and the overflow signals from some of the timers and based on the control signal passes one of the overflow signals as a toggle signal only during an effective interval of the enable signal(s).

Furthermore, a plurality of control units are provided. Each control unit receives the toggle signal from corresponding one of the logic units. Each control unit changes its output state based on the input timing of the toggle signal.

Other objects and features of this invention will become apparent from the following description with reference to the accompanying drawings.

DESCRIPTION OF THE PREFERRED EMBODIMENTS

Embodiments of the timer control circuit according to the present invention will be described in detail below while referring to the accompanying drawings.

Figure 1:
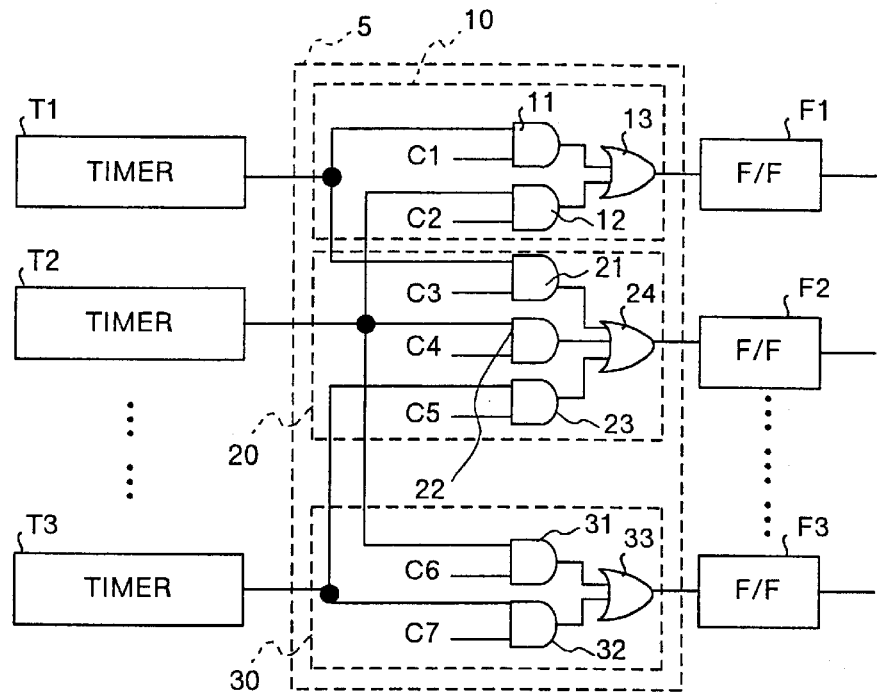
FIG. 1 is a circuit block diagram showing a first embodiment of a timer control circuit according to the present invention.

FIG. 1 is a diagram showing a first embodiment of a timer control circuit according to the present invention. This timer control circuit includes plurality of timers T1 to T3, signal selection logic circuit section 5, and plurality of flip-flops F1 to F3. The flip-flops F1 to F3 are, for example, flip-flops of set reset (SR) type. Output signals of the signal selection logic circuit section 5 are input to the flip-flops F1 to F3 as toggle signals. Control signals C1 to C7 input to the signal selection logic circuit section 5 are output from a circuit included in the personal computer.

The timers T1, T2 and T3 are incorporated in the microcomputer. In this case, the timers T1, T2 and T3 are set in mode so as to automatically conduct down counting for two periods in the same way as the foregoing description. Initial count values in the first and second periods are set to different values.

The signal selection logic circuit section 5 includes a signal selection circuit section 10 for the flip-flop F1, a signal selection circuit section 20 for the flip-flop F2, and a signal selection circuit section 30 for the flip-flop F3.

The signal selection circuit section 10 includes an AND circuit 11 for passing/blocking an output of the timer T1 according to the control signal C1, an AND circuit 12 for passing/blocking an output of the timer T2 according to the control signal C2, and an OR circuit 13 for deriving a logical sum of outputs of the AND circuits 11 and 12.

The signal selection circuit section 20 includes an AND circuit 21 for passing/blocking the output of the timer T1 according to the control signal C3, an AND circuit 22 for passing/blocking the output of the timer T2 according to the control signal C4, an AND circuit 23 for passing/blocking an output of the timer T3 according to the control signal C5, and an OR circuit 24 for deriving a logical sum of outputs of the AND circuits 21, 22 and 23.

The signal selection circuit section 30 includes an AND circuit 31 for passing/blocking an output of the timer T2 according to the control signal C6, an AND circuit 32 for passing/blocking an output of the timer T3 according to the control signal C7, and an OR circuit 33 for deriving a logical sum of outputs of the AND circuits 31 and 32.

Figure 2:
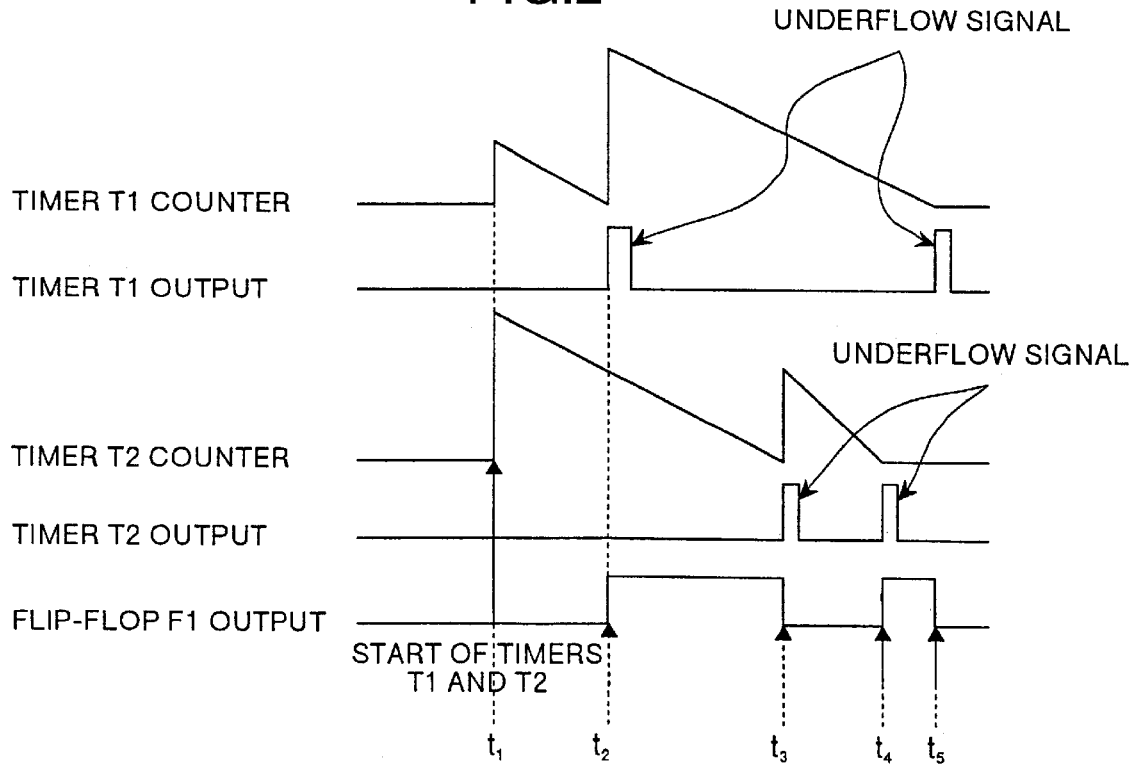
FIG. 2 is a time chart showing operation of the first embodiment.

Operation of the timer control circuit according to the first embodiment will now be described by referring to FIG. 2. FIG. 2 shows the output of the flip-flop F1 and signals relating to the output.

In this case, both of the control signals C1 and C2 are set to high logical level ("H"). In other words, the control signals C1 and C2 are fixed to "H" when the flip-flop F1 is used. It is not necessary to especially conduct "H" and low logical level ("L") changeover control according to a signal waveform to be output.

Subsequently, the timers T1 and T2 are started simultaneously (at time t1). The timers T1 and T2 begin counting. Thereafter, at time t2, down counting of a first period of the timer T1 is finished and the timer T1 outputs an underflow signal. At this time, the control signal C1 is "H". Therefore, the underflow signal supplied from the timer T1 is input to the flip-flop F1. As a result, an output signal of the flip-flop F1 is inverted (the time t2). By the way, the timer T1 begins down count operation of a second period at the time t2.

Subsequently, at time t3, down counting of a first period of the timer T2 is finished, and the timer T2 outputs an underflow signal. At this time, the control signal C2 is "H". Therefore, the underflow signal supplied from the timer T2 is input to the flip-flop F1. As a result, the output signal of the flip-flop F1 is inverted (the time t3) By the way, the timer T2 begins down count operation of a second period at the time t3.

Subsequently, at time t4, the down counting of the second period of the timer T2 is finished, and the timer T2 outputs a second underflow signal. At this time, the control signal C2 is "H". Therefore, the second underflow signal supplied from the timer T2 is input to the flip-flop F1. As a result, the output signal of the flip-flop F1 is inverted (the time t4).

Furthermore, at time t5, the down counting of the second period of the timer T1 is finished, and the timer T1 outputs a second underflow signal. At this time, the control signal C1 is "H". Therefore, the second underflow signal supplied from the timer T1 is input to the flip-flop F1. As a result, the output signal of the flip-flop F1 is inverted (the time t5). In this way, a waveform including two pulses as shown in FIG. 2 is formed.

Figure 6:
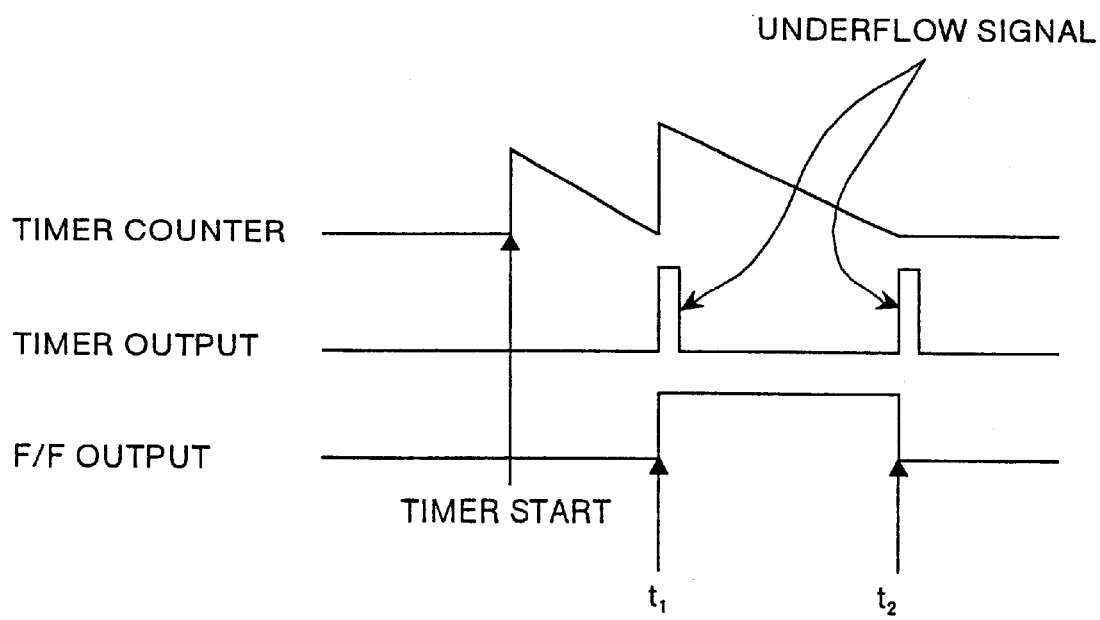
FIG. 6 is a time chart showing operation of a conventional technique of FIG. 5.
Figure 7:
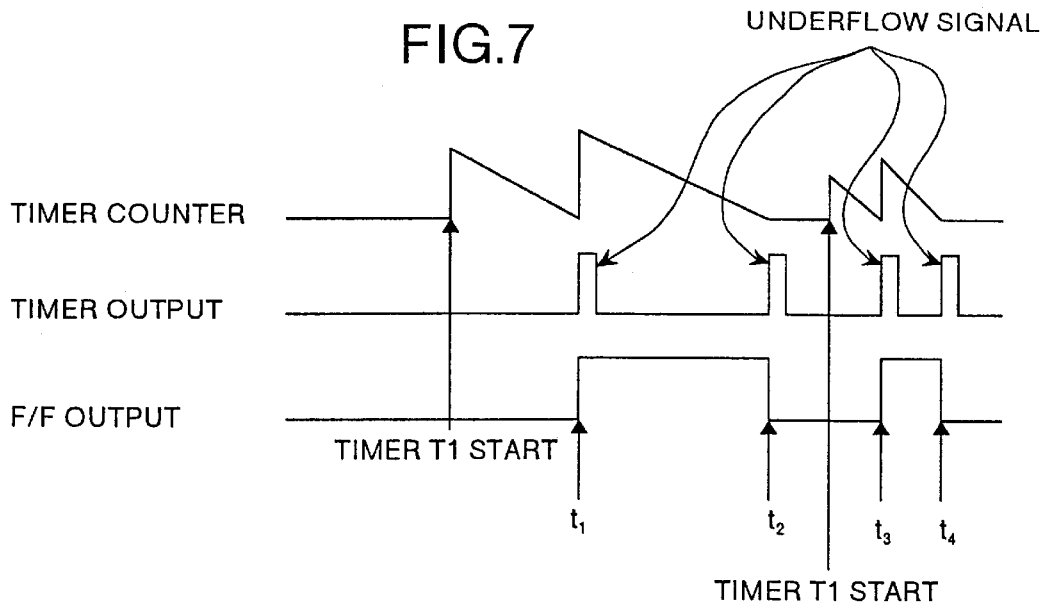
FIG. 7 is another time chart showing operation of the conventional technique of FIG. 5.
Figure 8:
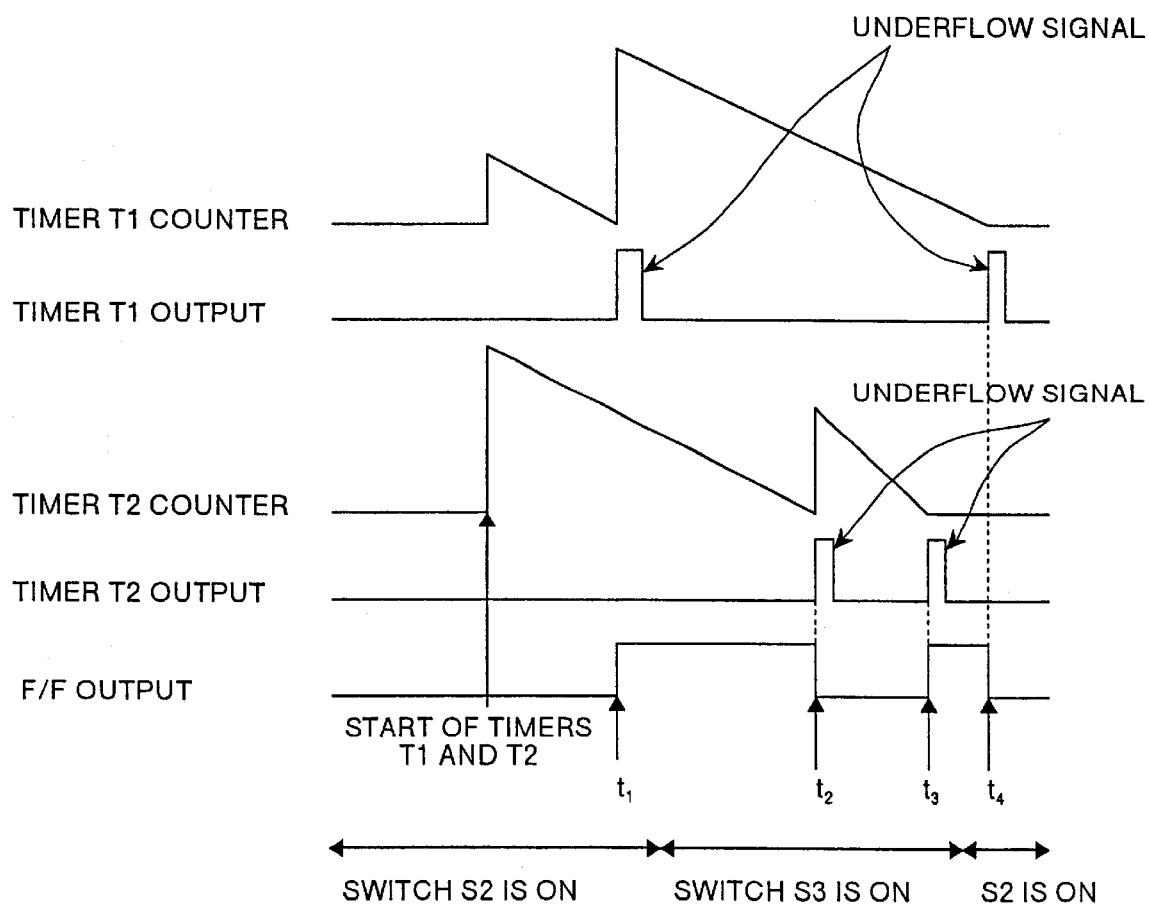
FIG. 8 is still another time chart showing operation of the conventional technique of FIG. 5.

If it is desired in the configuration of FIG. 1 to invert the output signal of the flip-flop F1 by only under flow signals supplied from the timer T1 as represented by an output waveform shown in FIG. 6, it can be accomplished by setting the control signal C2 to "L" and setting the control signal C1 to "H" . By doing so, the output signal of the flip-flop F1 is inverted only when the timer T1 has generated an underflow signal. Even if the timer T2 generates an underflow signal, the output signal of the flip-flop F1 can be prevented from being influenced the output signal of the timer T2.

In the case of the flip-flop F2, an output signal of the flip-flop F2 can be generated by combining underflow signals supplied from three timers T1, T2 and T3 although illustration of a waveform example is omitted.

If all desired timers are thus connected to a flip-flop, an arbitrary number of timers can be selected from among the connected timers in order to invert the output signal of the flip-flop.

Thus in the first embodiment, the signal selection logic circuit 5, which is hardware, is disposed between the timers and the flip-flops, and simultaneous use of a plurality of timers is made possible. Therefore, it becomes possible to form the complicated waveform by utilizing the timers without burdening software with a load.

Figure 3:
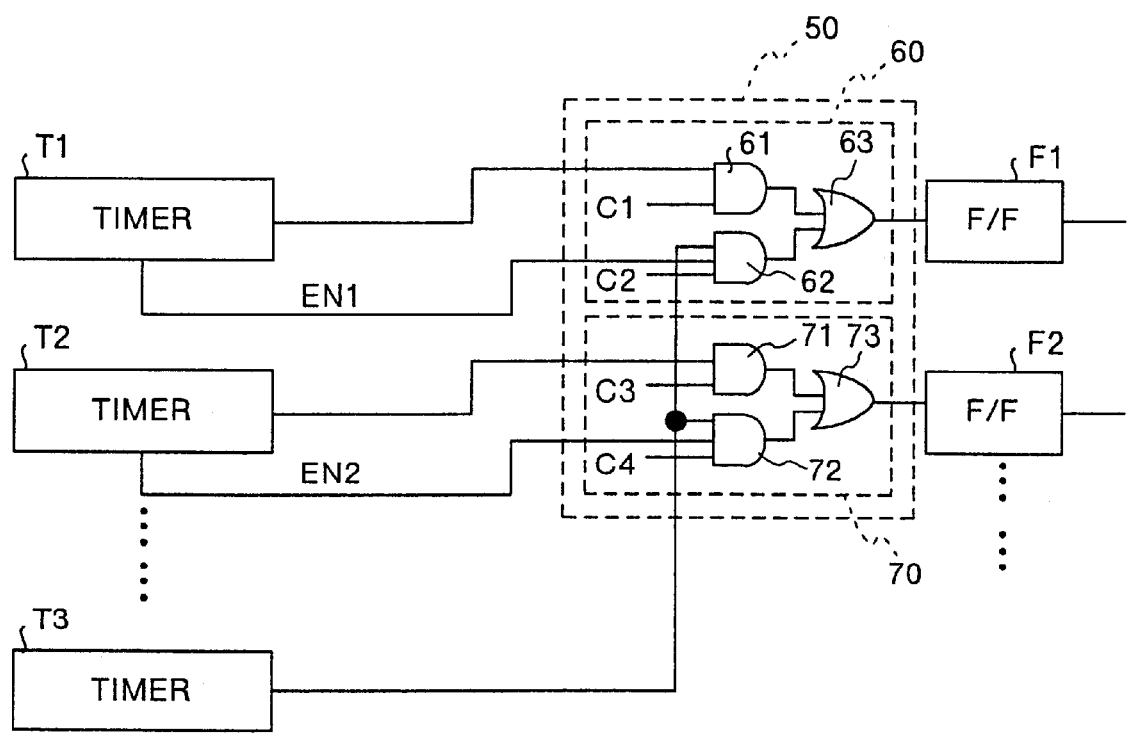
FIG. 3 is a circuit block diagram showing a second embodiment of a timer control circuit according to the present invention.

FIG. 3 is a diagram showing the second embodiment of a timer control circuit according to the present invention. In FIG. 3, T1, T2 and T3 denote timers, F1 and F2 denote flip-flops. C1 and C2 denote control signals for the flip-flop F,ad C3 and C4 denote control signals for the flip-flop F2. Numeral 50 denotes a signal selection logic circuit section. A signal EN1 is an enable signal output from the timer T1. This enable signal EN1 becomes "H" when the timer T1 is conducting count operation. A signal EN2 is an enable signal output from the timer T2. This enable signal EN2 becomes. "H" when the timer T2 is conducting count operation. In the second embodiment as well, the timers T1, T2 and T3 are set in mode so as to automatically conduct down counting for two periods in the same way as the foregoing description. Initial count values in the first and second periods are set to different values.

The signal selection logic circuit section 50 includes a signal selection circuit section 60 for the flip-flop F1, and a signal selection circuit section 70 for the flip-flop F2.

The signal selection circuit section 60 includes an AND circuit 61 for passing/blocking an output of the timer T1 according to the control signal C1, an AND circuit 62 for passing/blocking an output of the timer T3 according to the control signal C2 and the enable signal EN1, and an OR circuit 63 for deriving a logical sum of outputs of the AND circuits 61 and 62.

The signal selection circuit section 70 includes an AND circuit 71 for passing/blocking an output of the timer T2 according to the control signal C3, an AND circuit 72 for passing/blocking-the output of the timer T3 according to the control signal C4 and the enable signal EN2, and an OR circuit 73 for deriving a logical sum of outputs of the AND circuits 71 and 72.

Figure 4:
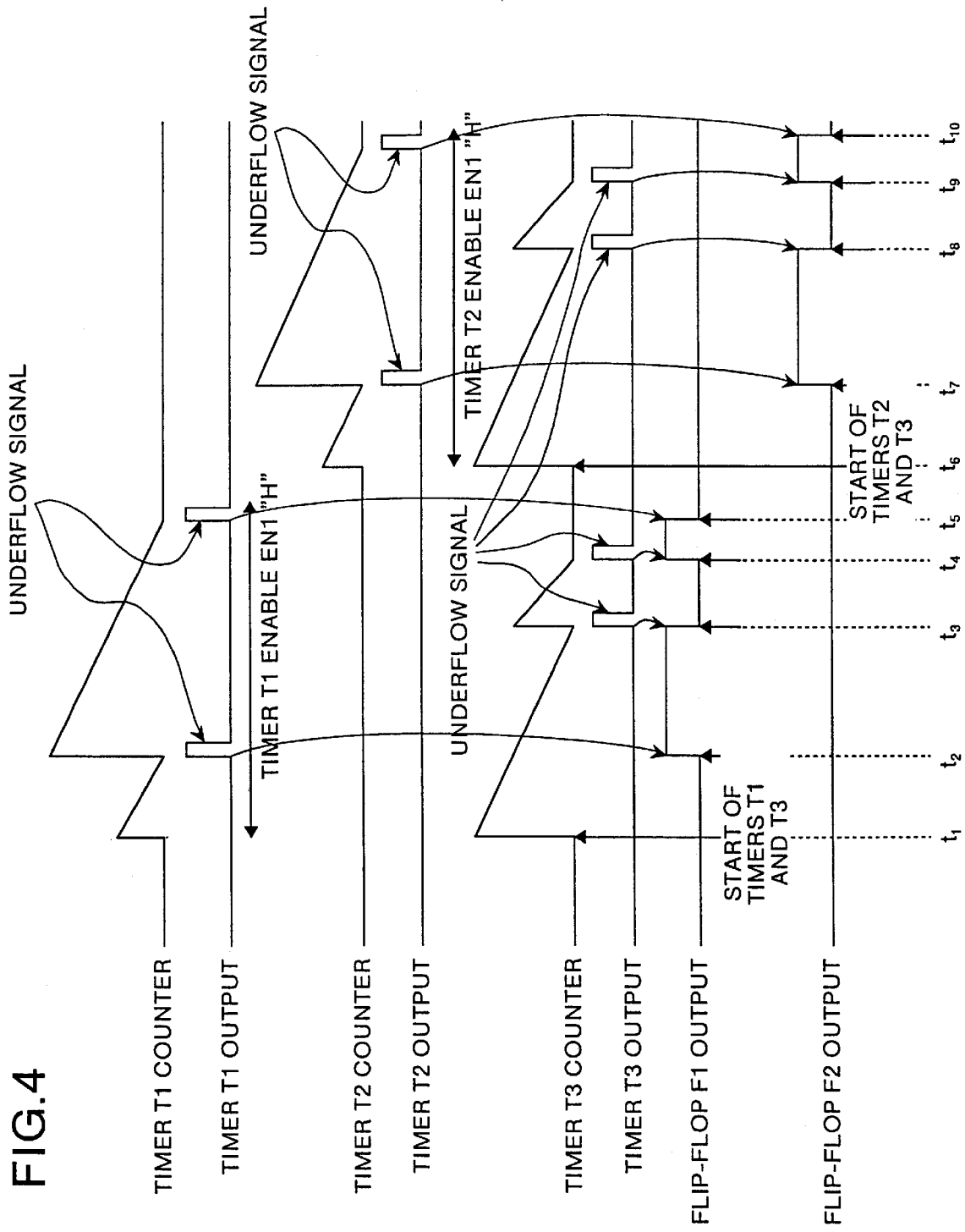
FIG. 4 is a time chart showing operation of the first embodiment.
Figure 5:
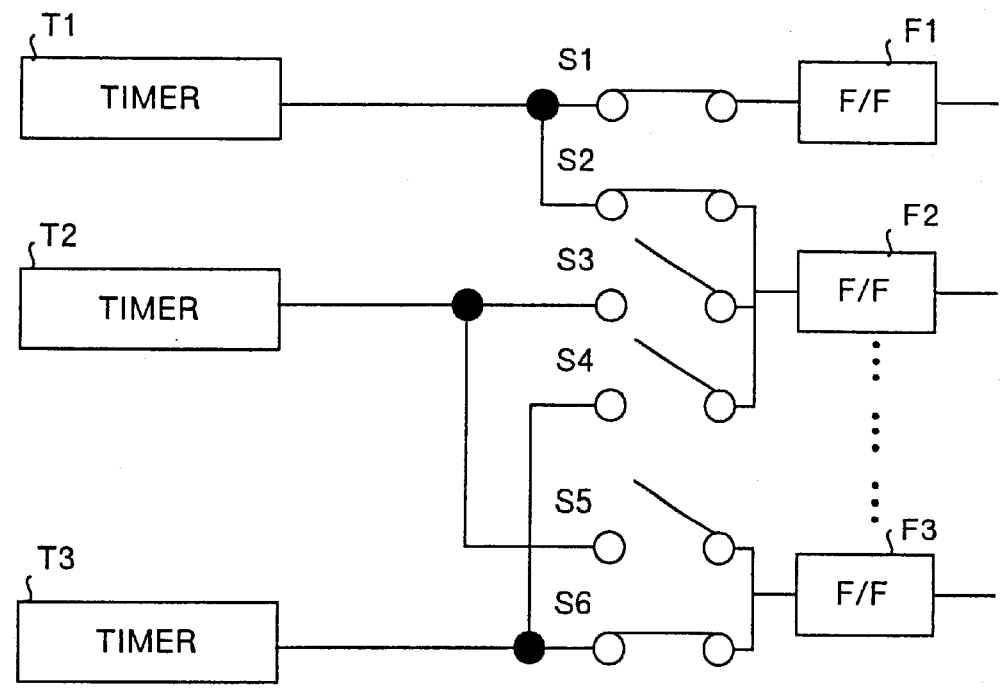
FIG. 5 is a circuit block diagram showing a configuration of a conventional timer output signal control circuit.

Operation of the timer control circuit according to the second embodiment will now be described by referring to FIG. 4. First, all of the control signals C1 and C2 for the flip-flop F1 and the control signals C3 and C4 for the flip-flop F2 are set to "H". Subsequently, the timers T1 and T3 are started simultaneously (at time t1). The timers T1 and T3 begin counting, and the enable signal EN1 output from the timer T1 becomes "H".

Thereafter, at time t2, down counting of a first period of the timer T1 is finished and the timer T1 outputs an underflow signal. At this time, the control signal C1 is "H". Therefore the underflow signal supplied from the timer T1 is input to the flip-flop F1. As a result, an output signal of the flip-flop F1 is inverted (the time t2). By the way, the timer T1 begins down count operation of a second period at the time t2.

Subsequently, at time t3, down counting of a first period of the timer T3 is finished and the timer T3 outputs an underflow signal. At this time, the control signal C2 and the enable signal EN1 are "H". Therefore, the underflow signal supplied from the timer T3 is input to the flip-flop F1. As a result, the output signal of the flip-flop F1 is inverted (the time t3). By the way, the timer T3 begins down count operation of a second period at the time t3.

Subsequently, at time t4, the down counting of the second period of the timer T3 is finished, and the timer T3 outputs a second underflow signal. At this time, the control signal C2 and the enable signal EN1 are "H". Therefore, the second underflow signal supplied from the timer T3 is input to the flip-flop F1. As a result, the output signal of the flip-flop F1 is inverted (the time t4)

Furthermore, at time t5, the down counting of the second period of the timer T1 is finished, and the timer T1 outputs a second underflow signal. At this time, the control signal C1 is "H". Therefore, the second underflow signal supplied from the timer T1 is input to the flip-flop F1. As a result, the output signal of the flip-flop F1 is inverted (the time t5). In this way, a two-pulse waveform is formed by the underflow signals supplied from the timers T1 and T3 during the enable signal EN1 supplied from the T1 being "H".

Subsequently, the timers T2 and T3 are started simultaneously (at time t6). As a result, the timers T2 and T3 begin counting, and the enable signal EN2 output from the timer T2 becomes "H".

There after, at time t7, down counting of a first period of the timer T2 is finished and the timer T2 outputs an underflow signal. At this time, the control signal C3 is "H". Therefore, the underflow signal supplied from the timer T2 is input to the flip-flop F2. As a result, an output signal of the flip-flop F2 is inverted (the time t7). By the way, the timer T2 begins down count operation of a second period at the time t7.

Subsequently, at time t8, down counting of a first period of the timer T3 is finished, and the timer T3 outputs an underflow signal. At this time, the control signal C4 and the enable signal EN2 are "H". Therefore, the underflow signal supplied from the timer T3 is input to the flip-flop F2. As a result, the output signal of the flip-flop F2 is inverted (the time t8). By the way, the timer T3 begins down count operation of a second period at the time t8.

Subsequently, at time t9, the down counting of the second period of the timer T3 is finished, and the timer T3 outputs a second underflow signal. At this time, the control signal C4 and the enable signal EN2 are "H". Therefore, the second underflow signal supplied from the timer T3 is input to the flip-flop F2. As a result, the output signal of the flip-flop F2 is inverted (the time t9).

Furthermore, at time t10, the down counting of the second period of the timer T2 is finished, and the timer T2 outputs a second underflow signal. At this time, the control signal C3 is "H". Therefore, the second underflow signal supplied from the timer T2 is input to the flip-flop F2. As a result, the output signal of the flip-flop F2 is inverted (the time t10). In this way, a two-pulse waveform is formed by the underflow signals supplied from the timers T2 and T3 during the enable signal EN2 supplied from the T2 being "H".

When an output of a timer (the timer T3 in this case) is used for control of a plurality of flip-flops (F1 and F2 in this case) simultaneously, enable signals of timers are not utilized in the first embodiment described earlier. Even in such intervals that neither the timer T1 nor the timer T2 is enabled, therefore, the output signals of the flip-flop F1 and F2 are inverted by the underflow signal of the timer T3. If the enable signals EN1 and EN2 of the timers are utilized as in the second embodiment, however, extra signal inversion as described above can be prevented.

In the second embodiment, the enable signals EN1 and EN2 of the timers are thus utilized. Even in the case where a certain timer is used simultaneously for control of a plurality of flip-flops, flip-flops can be prevented from being inverted by extra underflow signals of that timer.

While flip-flops are inverted by underflow signals of timers in the above described embodiments, overflow signals may also be used.

According to the timer control circuit of one aspect of the present invention, a logic circuit section implemented as hardware is disposed between a plurality of timers and flip-flops and simultaneous use of a plurality of timers is made possible as heretofore described. Therefore, it becomes possible to form a complicated waveform by utilizing timers, without burdening software with a load.

Furthermore, the logic circuit section includes a plurality of AND circuits and an OR circuit. As a result, it becomes possible to form a complicated waveform by utilizing timers, without burdening software with a load.

According to the timer control circuit of another aspect of the present invention, enable signals of the timers are input to a plurality of logic circuit sections, and the underflow signals supplied from the specific timer(s) are passed through the logic circuit sections only during effective intervals of the enable signals. Therefore, outputs of flip-flops are prevented from being inverted by extra underflow signals supplied from the specific timer/s. As a result, a desired signal waveform can be formed simply and efficiently.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A timer control circuit comprising:
   a plurality of timers, each timer performing a counting operation and outputting a signal when the counting operation is ended;
   a logic unit which receives a control signal and the signals output from all of said timers, and, based on the control signal, passes one of the signals as a toggle signal; and
   a control unit which receives the toggle signal from said logic unit, said control unit changing output state based on input timing of the toggle signal.

2. The timer control circuit according to claim 1, wherein each timer can count to a plurality of different count.

3. The timer control circuit according to claim 1, wherein said logic unit is a selector circuit comprising:
   a plurality of AND circuits for deriving logical products of the signals output from said timers and the control signal; and an OR circuit for deriving a logical sum of outputs of said AND circuits.

4. The timer control circuit according to claim 1, wherein said control unit is a set-reset (SR) flip-flop.

5. The timer control circuit according to claim 1, wherein the counting operation is a count-up operation and the signal output is an overflow signal.

6. The timer control circuit according to claim 1, wherein the counting operation is a count-down operation and the signal output is an underflow signal.

7. A timer control circuit comprising:
   a plurality of timers, each timer performing a counting operation, generating and outputting an enable signal during the counting operation, and outputting a final signal when the counting is ended;
   a plurality of logic units which commonly receive the final signal output from one of said timers and an enable signal output from at least one of said timers, each logic unit receiving a control signal and the final signals from some of said timers and, based on the control signal, passing one of the final signals as a toggle signal during respective intervals when the enable signals are effective; and
   a plurality of control units, each control unit receiving the toggle signal from a corresponding one of said logic units, each control unit changing output state based on input timing of the toggle signal.

8. The timer control circuit according to claim 7, wherein each of said timers can count to a plurality of different count values.

9. The timer control circuit according to claim 7, wherein each of said logic units is a selector circuit comprising:
   a plurality of AND circuits for deriving logical products of the final signals output from said timers and the control signal; and
   an OR circuit for deriving a logical sum of outputs of said AND circuits.

10. The timer control circuit according to claim 7, wherein each control unit is a set-reset (SR) flip-flop.

11. The timer control circuit according to claim 7, wherein the counting operation is a count-up operation and the final signal output is an overflow signal.

12. The timer control circuit according to claim 7, wherein the counting operation is a count-down operation and the final signal output is an underflow signal.

* * * * *